(12) United States Patent
Tanaka

(10) Patent No.: US 9,160,340 B2
(45) Date of Patent: Oct. 13, 2015

(54) OUTPUT CIRCUIT

(71) Applicant: FUJITSU SEMICONDUCTOR LIMITED, Yokohama-shi, Kanagawa (JP)

(72) Inventor: Hidetoshi Tanaka, Kasugai (JP)

(73) Assignee: SOCIONEXT INC., Yokohama (JP)

(*) Notice: Subject to any disclaimer, the term of this patent is extended or adjusted under 35 U.S.C. 154(b) by 0 days.

(21) Appl. No.: 14/589,491

(22) Filed: Jan. 5, 2015

(65) Prior Publication Data

US 2015/0194960 A1 Jul. 9, 2015

(30) Foreign Application Priority Data

Jan. 9, 2014 (JP) .................................. 2014-002514

(51) Int. Cl.
*H03K 19/094* (2006.01)
*H03K 19/0185* (2006.01)
*H03K 19/0175* (2006.01)

(52) U.S. Cl.
CPC .. *H03K 19/018507* (2013.01); *H03K 19/01759* (2013.01)

(58) Field of Classification Search
CPC ................ H03K 19/00315; H03K 19/018521; H03K 19/00361; H03K 19/0136
USPC ........... 326/21, 26–27, 30–31, 33–34, 82–83, 326/86–87; 327/108–109, 112
See application file for complete search history.

(56) References Cited

U.S. PATENT DOCUMENTS

| | | | | |
|---|---|---|---|---|
| 5,568,081 A * | 10/1996 | Lui et al. | ......................... | 327/380 |
| 6,184,708 B1 * | 2/2001 | Jenkins, IV | ..................... | 326/39 |
| 6,356,105 B1 * | 3/2002 | Volk | ................................ | 326/30 |
| 6,825,698 B2 * | 11/2004 | Wang et al. | ................... | 327/108 |
| 7,449,940 B2 | 11/2008 | Sunairi | | |
| 7,533,208 B2 * | 5/2009 | Strangfeld et al. | ............ | 710/302 |
| 7,973,563 B2 * | 7/2011 | Tran et al. | ........................ | 326/86 |
| 8,395,433 B2 * | 3/2013 | Rien et al. | ...................... | 327/313 |

FOREIGN PATENT DOCUMENTS

| | | |
|---|---|---|
| JP | 2004-282660 A | 10/2004 |
| JP | 2006-311201 A | 11/2006 |

\* cited by examiner

*Primary Examiner* — Jason M Crawford
(74) *Attorney, Agent, or Firm* — Arent Fox LLP

(57) ABSTRACT

An output circuit includes a driver circuit and a node control circuit. The driver circuit includes a first transistor and a second transistor. The first transistor includes one end coupled to an external terminal and the other end coupled to a first node. The second transistor includes one end coupled to the first node and the other end coupled to a wiring that is supplied with a power supply voltage. When the first transistor and the second transistor are deactivated, the node control circuit supplies a node control signal based on a voltage of the external terminal to the first node.

14 Claims, 9 Drawing Sheets

| Operation State | DU | DL | CT | CR | BE | Buffer Circuit |
|---|---|---|---|---|---|---|
| Output Hz/Pull-Resistance Off | H | L | H | H | H | Operate |
| Output Hz/Pull-Resistance On | H | L | H | L | H | Operate |
| Output/Pull-Resistance Off | H/L | H/L | L | H | H (L) | Operate (Stop) |
| Output/Pull-Resistance On | H/L | H/L | L | L | L | Stop |

| Operation State | DU | DL | CT | CR | CRX | Buffer Circuit |
|---|---|---|---|---|---|---|
| Output Hz/Pull-Resistance Off | H | L | H | H | L | Operate |
| Output Hz/Pull-Resistance On | H | L | H | L | H | Operate |
| Output/Pull-Resistance Off | H/L | H/L | L | H | L | Operate (Stop) |
| Output/Pull-Resistance On | H/L | H/L | L | L | H | Stop |

Fig.11

| Operation State | DU | DL | CT | CR |
|---|---|---|---|---|
| Output Hz/Pull-Resistance Off | H | L | H | H |
| Output Hz/Pull-Resistance On | H | L | H | L |
| Output/Pull-Resistance Off | H/L | H/L | L | H |
| Output/Pull-Resistance On | H/L | H/L | L | L |

US 9,160,340 B2

OUTPUT CIRCUIT

CROSS-REFERENCE TO RELATED APPLICATIONS

This application is based upon and claims the benefit of priority from prior Japanese Patent Application No. 2014-002514, filed on Jan. 9, 2014, the entire contents of which are incorporated herein by reference.

FIELD

This disclosure relates to an output circuit.

BACKGROUND

A semiconductor integrated circuit formed in a semiconductor chip is coupled to an external circuit via an external terminal (pad) of the semiconductor chip. Japanese Laid-Open Patent Publication Nos. 2004-282660 and 2006-311201 describe a semiconductor integrated circuit including an input and output circuit that inputs and outputs a signal from and to an external circuit.

For example, the semiconductor integrated circuit outputs a digital signal from an output circuit to a certain terminal. Further, the semiconductor integrated circuit sets the output circuit into a high-impedance state and receives a digital signal from that terminal.

In a sequential comparison type A/D converter, every time A/D conversion of each bit is performed, a capacitor is charged and discharged by an output signal from a D/A converter so as to change a comparison voltage. In other words, an output signal from the D/A converter to be used for charging and discharging the capacitor changes according to a comparison result of a previous bit. A time required for charging and discharging the capacitor is influenced by an increase in speed of the A/D conversion. However, when the increase in speed of the A/D conversion shortens a charge/discharge cycle period, the capacitor may not be sufficiently charged and discharged. As a result, a voltage difference is caused between a voltage according to a comparison result of previous bit and a comparison voltage obtained by the charging and discharging of the capacitor. This voltage difference causes erroneous determination in an operation for comparing a next bit. This deteriorates accuracy of a digital output signal.

SUMMARY

There has been a need to reduce the number of external terminals in a semiconductor chip. In order to reduce the number of the external terminals, for example, a digital signal and an analog signal may be input and output by using the same terminal. However, in this case, a circuit that processes a digital signal may influence an analog signal. Such an influence causes a decrease in an operation margin and a malfunction in a circuit that processes an analog signal.

One aspect of this disclosure is an output circuit. The output circuit includes a driver circuit and a node control circuit. The driver circuit includes a first transistor and a second transistor. The first transistor includes one end coupled to an external terminal and the other end coupled to a first node. The second transistor includes one end coupled to the first node and the other end coupled to a wiring that is supplied with a power supply voltage. When the first transistor and the second transistor are deactivated, the node control circuit supplies a node control signal based on a voltage of the external terminal to the first node.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The embodiment, together with objects and advantages thereof, may best be understood by reference to the following description of the presently preferred embodiments together with the accompanying drawings in which:

FIG. 11 is an operation explanatory diagram of the input and output circuit of FIG. 10.

DESCRIPTION OF THE EMBODIMENTS

Various embodiments will now be described with reference to the drawings. The embodiments are illustrated by way of example and are not limited by the accompanying figures, in which like references indicate similar elements. Elements in the figures are illustrated for simplicity and clarity and have not necessarily been drawn to scale.

Figure 1:
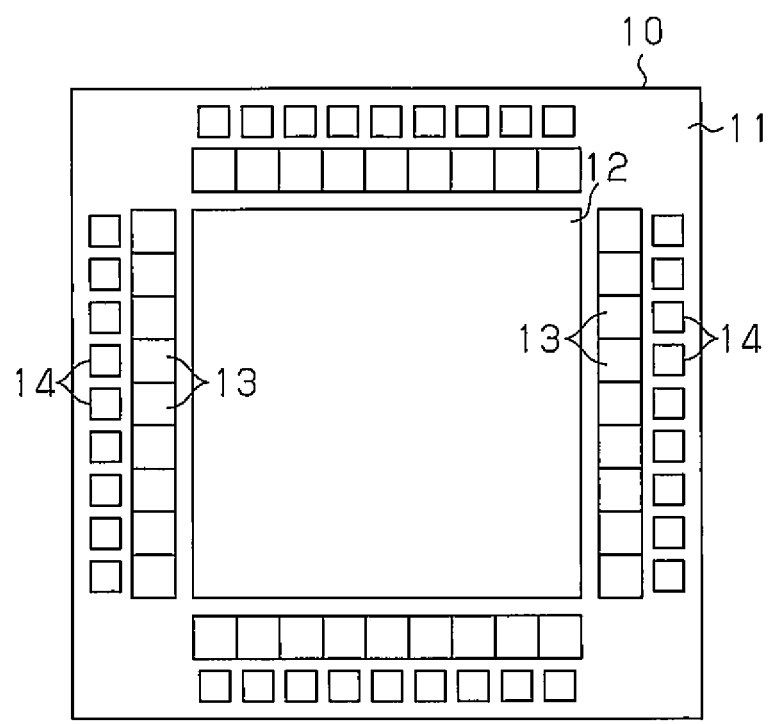
FIG. 1 is a schematic diagram of a semiconductor device.

As illustrated in FIG. 1, a semiconductor device 10 includes, for example, a rectangular substrate 11. The substrate 11 is, for example, a silicon substrate. The semiconductor device 10 includes an internal circuit 12, a plurality of input and output (hereinafter "input/output") circuits 13, and a plurality of external terminals (pads) 14.

The internal circuit 12 includes, for example, a digital macro and an analog macro. Examples of the digital macro are a processing circuit such as an arithmetic circuit that processes a digital signal, a storage circuit such as a memory, and a communication circuit that transmits and receives a digital signal to and from an external device. Examples of the analog macro are an analog-digital conversion circuit (ADC) that converts an analog signal from the external device into a digital signal, and a digital-analog conversion circuit (DAC) that converts a digital signal into an analog signal.

The input/output circuit 13 outputs an external signal according to an internal signal from the internal circuit 12 to the external terminal 14. Further, the input/output circuit 13 receives the external signal supplied from the external device to the external terminal 14, and outputs an internal signal according to the external signal to the internal circuit 12. The input/output circuit 13 may include only an output circuit that outputs the internal signal to the external terminal 14. Alternatively, the input/output circuit 13 may include only an input circuit that supplies an external signal to the internal circuit 12.

Various embodiments of the input/output circuit 13 will now be described below. In the following embodiments, like components are denoted by like reference symbols.

First Embodiment

Figure 2:
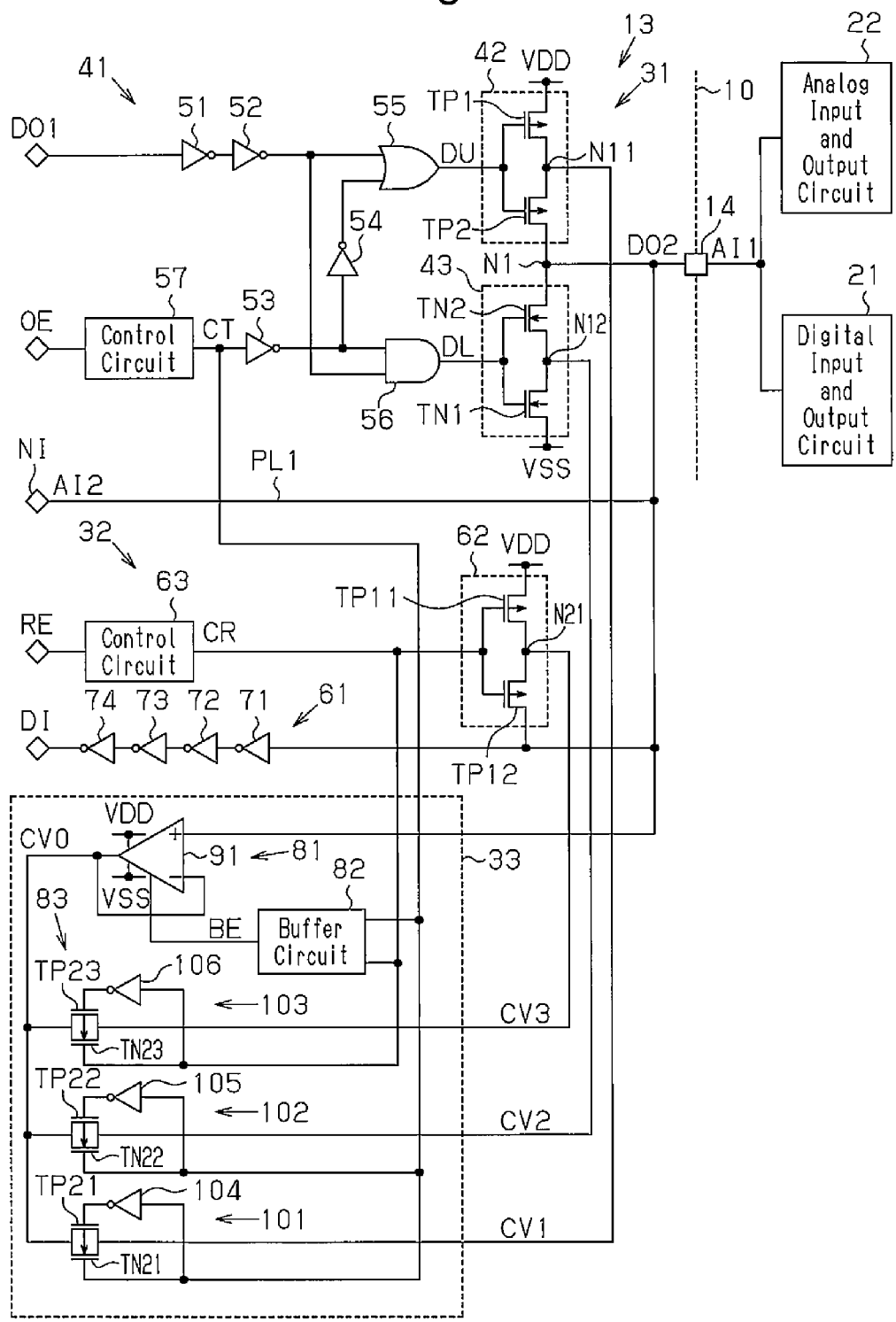
FIG. 2 is a circuit diagram of an input and output circuit according to a first embodiment.

As illustrated in FIG. 2, the input/output circuit 13 of the semiconductor device 10 includes an output circuit 31, an input circuit 32, and a node control circuit 33, which are coupled to an external terminal 14. Further, the input/output circuit 13 includes a coupling node NI (wiring PL1) that couples the external terminal 14 with the internal circuit 12 illustrated in FIG. 1.

A digital input and output circuit (hereinafter "digital input/output circuit") 21 and an analog input and output circuit (hereinafter "digital input/output circuit") 22 are coupled to the external terminal 14 of the semiconductor device 10. The digital input/output circuit 21 and the analog input/output circuit 22 may be arranged in a single semiconductor device or may be arranged in different semiconductor devices.

The output circuit 31 drives the external terminal 14 based on a digital output signal DO1 and an output control signal OE supplied from the internal circuit 12 illustrated in FIG. 1. In response to the output control signal OE, the output circuit 31 outputs a signal according to the digital output signal DO1 or sets an output terminal (node N1) of the output circuit 31 into a high-impedance state.

The output circuit 31 responds to the output control signal OE at a first level (for example, an L level corresponding to a low potential voltage VSS) and outputs an output signal DO2 having a level corresponding to the digital output signal DO1 to the external terminal 14. The output signal DO2 is supplied to the digital input/output circuit 21. Further, the output circuit 31 responds to the output control signal OE at a second level (for example, an H level corresponding to a high potential voltage VDD) and sets the output terminal (the node N1) into a high-impedance state.

The digital input/output circuit 21 outputs a digital signal to the internal circuit 12 illustrated in FIG. 1. The input circuit 32 coupled to the external terminal 14 generates a digital input signal DI from a digital signal and outputs the digital input signal DI to the internal circuit 12.

The analog input/output circuit 22 outputs an analog input signal to the internal circuit 12 illustrated in FIG. 1. The analog input signal is transmitted to an analog processing circuit (not illustrated) of the internal circuit 12 illustrated in FIG. 1 via the wiring PL1 coupled to the external terminal 14. The analog processing circuit outputs an analog output signal. The analog output signal is supplied to the analog input/output circuit 22 via the wiring PL1 and the external terminal 14.

The output circuit 31 includes a drive control circuit 41 and output driver circuits 42 and 43. The drive control circuit 41 generates control signals DU and DL based on the digital output signal DO1 and the output control signal OE. The control signal DU is supplied to the output driver circuit 42, and the control signal DL is supplied to the output driver circuit 43.

The drive control circuit 41 includes inverter circuits 51 to 54, an OR circuit 55, an AND circuit 56, and an output control circuit (in FIG. 2, described as a "control circuit") 57. The digital output signal DO1 is supplied to an input terminal of the inverter circuit 51. An output terminal of the inverter circuit 51 is coupled to an input terminal of the inverter circuit 52. An output terminal of the inverter circuit 52 is coupled to a first input terminal of the OR circuit 55 and a first input terminal of the AND circuit 56.

The output control signal OE is supplied to the output control circuit 57. The output control circuit 57 includes, for example, a buffer circuit and a level conversion circuit. The output control circuit 57 generates a control signal CT based on the output control signal OE. For example, the output control circuit 57 generates the control signal CT having a level that is logically equal to a level of the output control signal OE. The control signal CT is supplied to an input terminal of the inverter circuit 53. An output terminal of the inverter circuit 53 is coupled to an input terminal of the inverter circuit 54 and a second input terminal of the AND circuit 56. An output terminal of the inverter circuit 54 is coupled to a second input terminal of the OR circuit 55. The OR circuit 55 operates logical OR of two input signals to generate the control signal DU. The AND circuit 56 operates logical AND of two input signals to generate the control signal DL.

The drive control circuit 41 responds to, for example, the output control signal OE at the L level, and outputs the control signals DU and DL each having a level logically equal to the level of the digital output signal DO1. That is, the drive control circuit 41 outputs the H level control signals DU and DL when the digital output signal DO1 is at the H level, and outputs the L level control signals DU and DL when the digital output signal DO1 is at the L level. Further, the drive control circuit 41 responds to the H level output control signal OE, and outputs the H level control signal DU and the L level control signal DL.

The output driver circuit 42 includes transistors TP1 and TP2. The transistors TP1 and TP2 are P-channel MOS transistors. A source terminal of the transistor TP1 is coupled to a wiring (hereinafter, referred to as a wiring VDD) to which the high potential voltage VDD is supplied. A drain terminal of the transistor TP1 is coupled to a source terminal of the transistor TP2. A drain terminal of the transistor TP2 is coupled to the external terminal 14. That is, the transistors TP1 and TP2 are cascade-coupled between the external terminal 14 and the wiring VDD. The control signal DU is supplied to gate terminals of the transistors TP1 and TP2. The transistors TP1 and TP2 are activated and deactivated by the control signal DU. For example, the transistors TP1 and TP2 are activated by the L level control signal DU, and are deactivated by the H level control signal DU.

The output driver circuit 43 includes transistors TN1 and TN2. The transistors TN1 and TN2 are N-channel MOS transistors. A source terminal of the transistor TN1 is coupled to a wiring (hereinafter, referred to as a wiring VSS) to which the low potential voltage VSS is supplied. A drain terminal of the transistor TN1 is coupled to a source terminal of the transistor TN2. A drain terminal of the transistor TN2 is coupled to the external terminal 14. That is, the transistors TN1 and TN2 are cascade-coupled between the external terminal 14 and the wiring VSS. The control signal DL is supplied to gate terminals of the transistors TN1 and TN2. The transistors TN1 and TN2 are activated and deactivated by the control signal DL. For example, the transistors TN1 and TN2 are activated by the H level control signal DL, and are deactivated by the L level control signal DL.

The output circuit 31 generates the H level control signals DU and DL based on the H level digital output signal DO1 and the L level output control signal OE. The H level control signal DU deactivates the transistors TP1 and TP2, and the H level control signal DL activates the transistors TN1 and TN2. Therefore, the output circuit 31 outputs the L level (the level of the low potential voltage VSS) output signal DO2.

The output circuit 31 generates the L level control signals DU and DL based on the L level digital output signal DO1 and the L level output control signal OE. The L level control signal DU activates the transistors TP1 and TP2, and the L level control signal DL deactivates the transistors TN1 and TN2. Therefore, the output circuit 31 outputs the H level (the level of the high potential voltage VDD) output signal DO2.

The output circuit 31 then generates the H level control signal DU and the L level control signal DL based on the H level output control signal OE. This deactivates the transistors TP1, TP2, TN1 and TN2. As a result, the output circuit 31 sets the node N1 (i.e., the output terminal) coupled to the external terminal 14 into a high-impedance state.

The input circuit 32 includes a buffer circuit 61, a pull-up circuit 62, and a pull-up control circuit (in FIG. 2, described as a "control circuit") 63.

The buffer circuit 61 includes a plurality of (four in FIG. 2) inverter circuits 71 to 74 that are coupled in series. An input terminal of the inverter circuit 71 is coupled to the external terminal 14. The inverter circuit 74 outputs the digital input signal DI having a level logically equal to a level of a signal to be supplied to the external terminal 14.

A pull resistance control signal RE is supplied to the pull-up control circuit 63. The pull-up control circuit 63 includes, for example, a buffer circuit and a level conversion circuit. The pull-up control circuit 63 generates a control signal CR based on the pull resistance control signal RE. For example, the pull-up control circuit 63 generates the control signal CR having a level logically equal to a level of the pull resistance control signal RE. The control signal CR is supplied to the pull-up circuit 62.

The pull-up circuit 62 includes transistors TP11 and TP12. The transistors TP11 and TP12 are P-channel MOS transistors. A source terminal of the transistor TP11 is coupled to the wiring VDD. A drain terminal of the transistor TP11 is coupled to a source terminal of the transistor TP12. A drain terminal of the transistor TP12 is coupled to the external terminal 14. That is, the transistors TP11 and TP12 are cascade-coupled between the external terminal 14 and the wiring VDD.

The control signal CR is supplied to gate terminals of the transistors TP11 and TP12. The transistors TP11 and TP12 are activated and deactivated by the control signal CR. For example, the transistors TP11 and TP12 are activated by the L level control signal CR, and are deactivated by the H level control signal CR. The activated transistors TP11 and TP12 pull up the external terminal 14 to the high potential voltage VDD based on the respective on-resistance.

The node control circuit 33 generates a control signal CV1 based on a voltage of the external terminal 14 to control a voltage of a node N11 between the transistors TP1 and TP2 of the output driver circuit 42. Further, the node control circuit 33 generates a control signal CV2 based on the voltage of the external terminal 14 to control a voltage of a node N12 between the transistors TN1 and TN2 of the output driver circuit 43. Further, the node control circuit 33 generates a control signal CV3 based on the voltage of the external terminal 14 to control a voltage of a node N21 between the transistors TP11 and TP12 of the pull-up circuit 62 in the input circuit 32.

The node control circuit 33 includes a buffer circuit 81, a buffer control circuit 82, and a switch circuit 83. The buffer circuit 81 includes an operational amplifier 91. The operational amplifier 91 includes a high potential side power supply terminal coupled to the wiring VDD and a low potential side power supply terminal coupled to the wiring VSS. Further, the operational amplifier 91 includes a non-inverting input terminal, an inverting input terminal, and an output terminal. The non-inverting input terminal is coupled to the external terminal 14, and the inverting input terminal is coupled to the output terminal. Therefore, the operational amplifier 91 serves as a non-inverting amplifying circuit, of which gain A is "1." That is, the buffer circuit 81 outputs a control signal CV0 (node control signal) having a voltage equal to the voltage of an analog input signal AI1 to be supplied to the external terminal 14.

The operational amplifier 91 operates or stops in response to a buffer control signal BE that is supplied from the buffer control circuit 82. For example, the operational amplifier 91 operates in response to the H level buffer control signal BE and stops in response to the L level buffer control signal BE.

The buffer control circuit 82 generates the buffer control signal BE based on the control signal CT, which is output from the output control circuit 57 of the output circuit 31, and the control signal CR, which is output from the pull-up control circuit 63 of the input circuit 32. For example, when the output terminal (the node N1) of the output circuit 31 is in a high-impedance state (the control signal CT is at the H level), the buffer control circuit 82 generates the H level buffer control signal BE. Further, when the output circuit 31 outputs the output signal DO2 (the control signal CT is at the L level), the buffer control circuit 82 generates the buffer control signal BE having a level equal to the level of the control signal CR.

An output terminal of the buffer circuit 81, that is, the output terminal of the operational amplifier 91 is coupled to the switch circuit 83. The switch circuit 83 includes three analog switches 101 to 103 corresponding to three nodes to be controlled, that is, the nodes N11, N12 and N21.

The analog switch 101 includes a P-channel MOS transistor TP21 and an N-channel MOS transistor TN21, which are coupled in parallel to each other, and an inverter circuit 104. The transistors TP21 and TN21 are coupled between the output terminal of the buffer circuit 81 and the node N11. The control signal CT is supplied to a gate terminal of the transistor TN21. An output signal from the inverter circuit 104 is supplied to a gate terminal of the transistor TP21. The inverter circuit 104 outputs a logical inversion signal of the control signal CT. Thus, the analog switch 101 is activated by the H level control signal CT, and is deactivated by the L level control signal CT. The activated analog switch 101 outputs the control signal CV1 (node control signal) that is equal to the control signal CV0 output from the buffer circuit 81. The control signal CV1 is supplied to the node N11 between the transistors TP1 and TP2 of the output driver circuit 42.

Similarly, the analog switch 102 includes a P-channel MOS transistor TP22 and an N-channel MOS transistor TN22, which are coupled in parallel to each other, and an inverter circuit 105. The analog switch 102 is activated and deactivated by the control signal CT. The activated analog switch 102 outputs the control signal CV2 (node control signal) equal to the control signal CV0 output from the buffer circuit 81. This control signal CV2 is supplied to the node N12 between the transistors TN1 and TN2 of the output driver circuit 43.

Similarly, the analog switch 103 includes a P-channel MOS transistor TP23 and an N-channel MOS transistor TN23, which are coupled in parallel to each other, and an inverter circuit 106. The analog switch 103 is activated and deactivated by the control signal CR. The activated analog switch 103 outputs the control signal CV3 (node control signal) equal to the control signal CV0 output from the buffer circuit 81. This control signal CV3 is supplied to the node N21 between the transistors TP11 and TP12 of the pull-up circuit 62.

The operation of the input/output circuit 13 will now be described below.

Figures 3, 4:
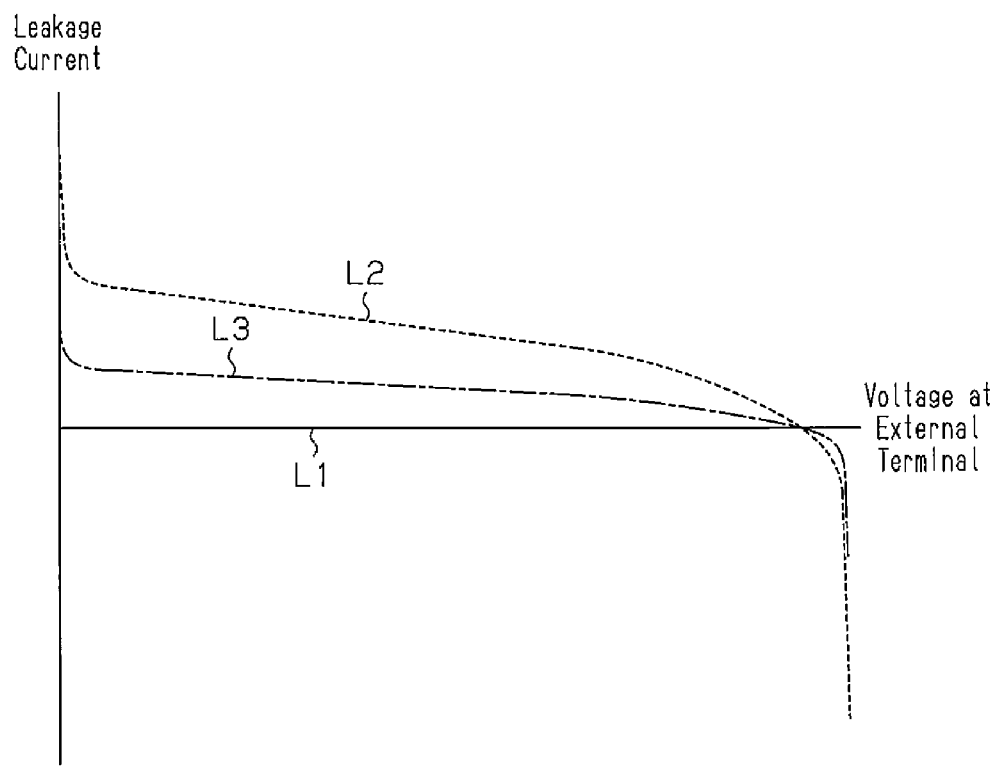
FIG. 3 is an operation explanatory diagram of the input and output circuit of FIG. 2.
FIG. 4 is a graph illustrating a characteristic of the input and output circuit of FIG. 2.

FIG. 3 illustrates a logic level of each of the control signals DU, DL, CT, CR, and BE according to an operation state of the input/output circuit 13, and an operation state of the buffer circuit 81 of the node control circuit 33.

For example, an operation state "Output Hz/Pull-Resistance Off" indicates that the output terminal (the node N1 illustrated in FIG. 2) of the output circuit 31 is in a high-impedance state and the pull-up circuit 62 of the input circuit 32 is in a deactivated state. At this time, the output control signal OE is at the H level, and the pull resistance control signal RE is at the H level.

The drive control circuit 41 illustrated in FIG. 2 generates the H level control signal CT, the H level control signal DU, and the L level control signal DL based on the H level output control signal OE. The output driver circuit 42 is deactivated by the H level control signal DU, and the output driver circuit 43 is deactivated by the L level control signal DL.

The pull-up control circuit 63 generates the H level control signal CR based on the H level pull resistance control signal RE. The pull-up circuit 62 is deactivated by the H level control signal CR.

The buffer control circuit 82 generates the H level buffer control signal BE based on the H level control signals CT and CR. The buffer circuit 81 operates in response to the H level buffer control signal BE, and outputs the control signal CV0 having a level equal to a level of the external terminal 14.

The analog switches 101 and 102 are activated by the H level control signal CT. The activated analog switch 101 generates the control signal CV1 equal to the control signal CV0 from the buffer circuit 81. This control signal CV1 is supplied to the node N11 between the transistors TP1 and TP2 of the output driver circuit 42. At this time, the analog input signal AI1 is supplied to the drain terminal of the transistor TP2. Then, the control signal CV1 supplied to the node N11 has a voltage equal to the voltage of the analog input signal AI1. Therefore, a potential difference between the source and drain terminals of the transistor TP2 is 0 (zero). Thus, current does not flow between the source and drain terminals of the transistor TP2. That is, there is no leak current through the transistor TP2.

The control signal CV1 is supplied to the node N11, namely, the drain terminal of the transistor TP1. The high potential voltage VDD is supplied to the source terminal of the transistor TP1. Thus, a difference voltage between the high potential voltage VDD and the voltage of the control signal CV1 (i.e., the analog input signal AI1) is applied between the source and drain terminals of the transistor TP1. The difference voltage causes a leak current to flow through the transistor TP1. This leak current, however, flows from the drain terminal (node N11) of the transistor TP1 to the wiring VSS via the analog switch 101 and the buffer circuit 81 (operational amplifier 91).

Therefore, in the output driver circuit 42, the leak current does not flow through the transistor TP2. Rather, the leak current through the transistor TP1 flows to the wiring VSS via the analog switch 101 and the buffer circuit 81 (operational amplifier 91). Thus, the output driver circuit 42 does not influence the voltage of the analog input signal AI2 supplied to the internal circuit 12 via the wiring PL1.

Further, the activated analog switch 102 generates the control signal CV2 equal to the control signal CV0 from the buffer circuit 81. The control signal CV2 is supplied to the node N12 between the transistors TN1 and TN2 of the output driver circuit 43. At this time, the analog input signal AI1 is supplied to the drain terminal of the transistor TN2. Then, the control signal CV2 supplied to the node N12 has a voltage equal to the voltage of the analog input signal AI1. Therefore, a potential difference between the source and drain terminals of the transistor TN2 is 0 (zero). Thus, current does not flow between the source and drain terminals of the transistor TN2. That is, there is no leak current through the transistor TN2.

The control signal CV2 is supplied to the node N12, namely, the drain terminal of the transistor TN1. The low potential voltage VSS is supplied to the source terminal of the transistor TN1. Thus, a difference voltage between the low potential voltage VSS and the voltage of the control signal CV2 (i.e., the analog input signal AI1) is applied between the source and drain terminals of the transistor TN1. The difference voltage causes a leak current to flow through the transistor TN1. This leak current, however, flows through a current path from the wiring VDD to the wiring VSS via the buffer circuit 81 (operational amplifier 91), the analog switch 102, and the transistor TN1.

Therefore, in the output driver circuit 43, the leak current does not flow through the transistor TN2. Rather, the leak current through the transistor TN1 flows from the wiring VDD via the buffer circuit 81 and the analog switch 102. Thus, the output driver circuit 43 does not influence the voltage of the analog input signal AI2 supplied to the internal circuit 12 via the wiring PL1.

The analog switch 103 is activated by the H level control signal CR. The activated analog switch 103 generates the control signal CV3 equal to the control signal CV0 from the buffer circuit 81. This control signal CV3 is supplied to the node N21 between the transistors TP11 and TP12 of the pull-up circuit 62. At this time, the analog input signal AI1 is supplied to the drain terminal of the transistor TP12. Then, the control signal CV3 supplied to the node N21 has a voltage equal to the voltage of the analog input signal AI1. Therefore, a potential difference between the source and drain terminals of the transistor TP12 is 0 (zero). Thus, current does not flow between the source and drain terminals of the transistor TP12. That is, there is no leak current through the transistor TP12.

The control signal CV3 is supplied to the node N21, namely, the drain terminal of the transistor TP11. The high potential voltage VDD is supplied to the source terminal of the transistor TP11. Therefore, a difference voltage between the high potential voltage VDD and the voltage of the control signal CV3 (i.e., the analog input signal AI1) is applied between the source and drain terminals of the transistor TP11. The difference voltage causes a leak current to flow through the transistor TP11. This leak current, however, flows from the drain terminal of the transistor TP11 to the wiring VSS via the analog switch 103 and the buffer circuit 81.

Therefore, in the pull-up circuit 62, the leak current does not flow through the transistor TP12. Rather, the leak current through the transistor TP11 flows to the wiring VSS via the analog switch 103 and the buffer circuit 81. Thus, the pull-up circuit 62 does not influence the voltage of the analog input signal AI2.

Accordingly, the input/output circuit 13 suppresses an undesirable change in a waveform of the analog input signal AI2 supplied to the internal circuit 12 with respect to a waveform of the analog input signal AI1 supplied from the external device.

A comparative example with respect to the input/output circuit 13 will now be described below. In the comparative example, the components and signals that are the same as those of the input/output circuit 13 are denoted by the same reference symbols.

Figure 5:
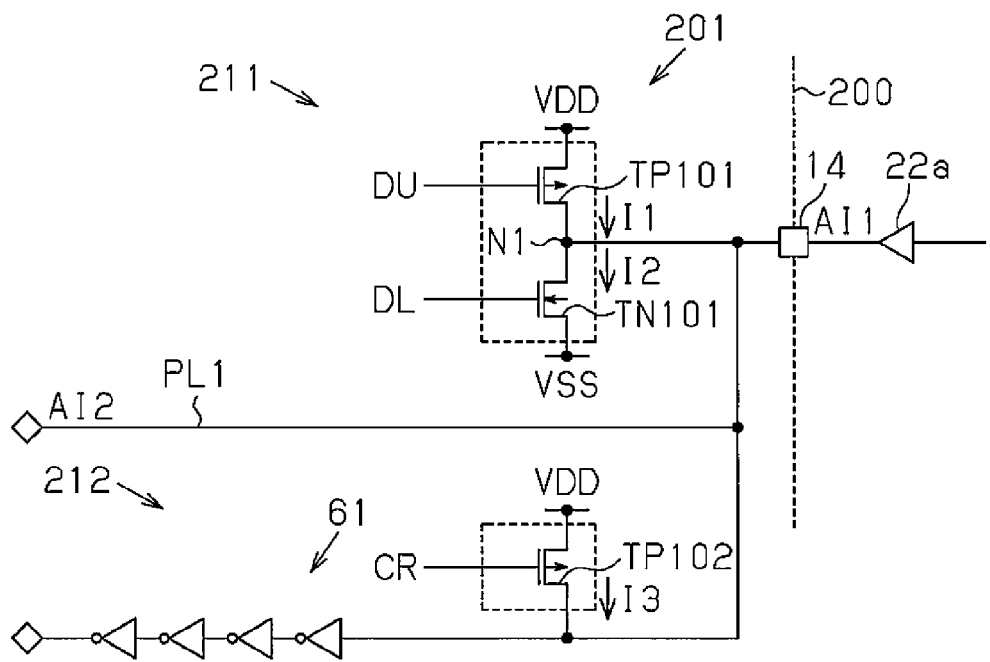
FIG. 5 is a circuit diagram of an input and output circuit according to a comparative example.

FIG. 5 illustrates a semiconductor device 200 including an input/output circuit 201 according to the comparative example. The input/output circuit 201 coupled to an external terminal 14 of the semiconductor device 200 includes an output circuit 211 and an input circuit 212.

The output circuit 211 includes a P-channel MOS transistor TP101 and an N-channel MOS transistor TN101. A source terminal of the transistor TP101 is coupled to a wiring VDD. A drain terminal of the transistor TP101 is coupled to a drain terminal of the transistor TN101. A source terminal of the transistor TN101 is coupled to a wiring VSS. A node N1 between the drain terminal of the transistor TP101 and the drain terminal of the transistor TN101 is coupled to the external terminal 14. The output circuit 211 has a structure similar to that of the drive control circuit 41 illustrated in FIG. 2, and includes a drive control circuit (not illustrated) that generates control signals DU and DL. The control signal DU is supplied to a gate terminal of the transistor TP101, and the control signal DL is supplied to a gate terminal of the transistor TN101.

The input circuit 212 includes a buffer circuit 61 and a P-channel MOS transistor TP102 for pull-up. A source terminal of the transistor TP102 is coupled to the wiring VDD. A drain terminal of the transistor TP102 is coupled to the external terminal 14. An input circuit 32 has a structure similar to that of the pull-up control circuit 63 illustrated in FIG. 2, and includes a pull-up control circuit (not illustrated) that generates a control signal CR. The transistor TP102 is activated and deactivated by the control signal CR.

An analog output circuit 22a provided as an external device of the semiconductor device 200 supplies an analog input signal AI1 to the external terminal 14 coupled to the input/output circuit 201. The analog output circuit 22a is a high-impedance output circuit. The analog input signal AI1 is supplied to an internal circuit (not illustrated) via a wiring PL1 coupled to the external terminal 14. An analog input signal that is supplied to the internal circuit via the wiring PL1 is denoted by "AI2" so as to be discriminated from the analog input signal AI1 output from the analog output circuit 22a.

When the analog input signal AI1 is supplied to the external terminal 14, the transistors TP101 and TN101 of the output circuit 211 are deactivated by the control signals DU and DL, respectively. The transistor TP102 of the input circuit 212 is deactivated by the control signal CR. However, a leak current I1 flows through the transistor TP101 due to a difference voltage between a high potential voltage VDD at its source terminal and the voltage of the analog input signal AI1 at its drain terminal. Similarly, a leak current I2 flows through the transistor TN101 due to a difference voltage between a low potential voltage VSS at its source terminal and the voltage of the analog input signal AI1 at its drain terminal. Similarly, a leak current I3 flows through the transistor TP102 due to a difference voltage between the high potential voltage VDD at its source terminal and the voltage of the analog input signal AI1 at its drain terminal.

The leak currents I1, I2 and I3 influence the analog input signal AI1 transmitted via the wiring PL1. The leak currents I1 and I3 flowing through the transistors TP101 and TP102 increase the level of the analog input signal AI1. The leak current I2 flowing through the transistor TN101 decreases the level of the analog input signal AI1. Therefore, the output circuit 211 and the input circuit 212 change the voltage of the analog input signal AI2 supplied to the internal circuit (analog circuit) via the wiring PL1 with respect to the voltage of the analog input signal AI1 output from the analog output circuit 22a.

Figure 6:
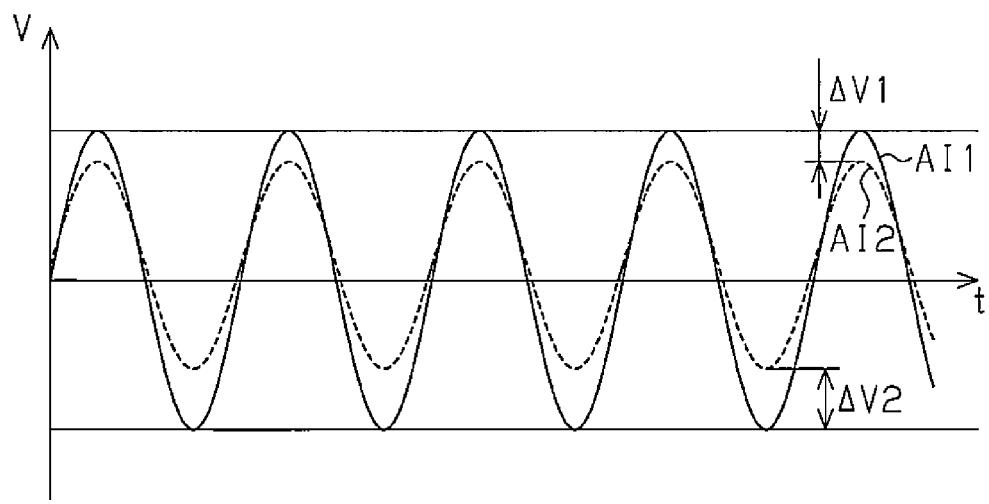
FIG. 6 is an operation waveform chart of the input and output circuit of the comparative example.

As illustrated in FIG. 6, the analog input signal AI1 has an amplitude that changes between the high potential voltage VDD and the low potential voltage VSS. The leak currents I1, I2, and I3 cause the analog input signal AI2 having an amplitude smaller than the amplitude of the analog input signal AI1. A difference voltage $\Delta V1$ between the analog input signals AI1 and AI2 is caused by the leak current I2 flowing through the transistor TN101 in FIG. 5. Further, a difference voltage $\Delta V2$ between the analog input signals AI1 and AI2 is caused by the leak current I1 flowing through the transistor TP101 and the leak current I3 flowing through the transistor TP102 in FIG. 5.

A leak current in an MOS transistor changes according to the size of a gate terminal (gate length L and gate width W). In view of this, in the input/output circuit 201 of the comparative example, the sizes of the gate terminals of the transistors TP101, TN101, and TP102 (gate length L and gate width W) may be adjusted in a design process so that the leak current in each of the transistors TP101, TN101 and TP102 can be reduced.

For example, the leak current may be reduced by increasing the gate length L or decreasing the gate width W. However, the value of the leak current in the transistor depends on variations of a manufacturing process, a temperature, and a voltage of the semiconductor device.

For example, in FIG. 4, each of a broken line L2 and a dashed line L3 indicates a leak current with respect to the voltage of the external terminal 14 in the transistor where the gate length L is adjusted so as to reduce the leak current. In FIG. 4, a horizontal axis represents the voltage at the external terminal 14 and a vertical axis represents the leak current.

The broken line L2 indicates a leak current in a transistor manufactured under a worst condition. The dashed line L3 indicates a leak current in a transistor manufactured under a best condition. In such a manner, even in the same types of transistors, the leak current changes depending on variations of the manufacturing process. Further, the voltage of the external terminal 14 changes between the low potential voltage VSS and the high potential voltage VDD in accordance with the change in the analog input signal. Thus, the leak current in the transistor changes according to a potential difference between the voltage of the external terminal 14 and the high potential voltage VDD or the low potential voltage VSS.

In the present embodiment, the control signal CV0 (CV1, CV2, and CV3) according to the voltage of the external terminal 14 is supplied to the source terminals of the transistors TP2, TN2, and TP12 coupled to the external terminal 14, respectively, so as to keep the voltage between the source and drain terminals of each of the transistors TP2, TN2, and TP12 at 0 (zero). Since the control signal CV0 (CV1 to CV3) is generated according to the voltage of the external terminal 14, the voltage between the source and drain terminals of each of the transistors TP2, TN2, and TP12 is kept at 0 even when the voltage of the external terminal 14 changes. Therefore, as indicated by a sold line L1 in FIG. 4, the value of the leak current in each of the transistors TP2, TN2, and TP12 does not depend on the change in the voltage of the external terminal 14. Further, the value of the leak current does not depend on the manufacturing process and the temperature.

For example, in the comparative example illustrated in FIG. 5, the gate length L and the gate width W of the transistor TP101 are set to [L=X, W=Y]. The values X and Y are determined so that the leak current in the transistor TP101 is reduced. In this case, in order to reduce the leak current in the transistor TN101, for example, the gate length L and the gate width W of the transistor TN101 are set to [L=X, W=0.43Y]. Further, the gate length L and the gate width W of the transistor TP102 are set to [L=0.5X, W=Z]. The value Z is determined so that the leak current in the transistor TP102 is reduced.

In contrast, in the input/output circuit 13 of the present embodiment, the gate length L and the gate width W of each of the transistors TP1 and TP2 of the output driver circuit 42 are set to [L=0.35X, W=0.65Y]. Further, the gate length L and the gate width W of each of the transistors TN1 and TN2 of the output driver circuit 43 are set to [L=0.35X, W=0.27Y]. Further, the gate length L and the gate width W of each of the transistors TP11 and TP12 of the pull-up circuit 62 in the input circuit 32 are set to [L=0.35X, W=0.6Z]. The values of the gate length L and the gate width W are set so as to obtain a transistor characteristic (output driving ability) similar to that in the comparative example. However, these values are only examples and thus the values of the gate length and the gate width are not limited to the values described above.

The transistor coupled to the external terminal 14 acts as a capacitive load with respect to the external terminal 14. When the size of the gate terminal of the transistor is larger, such a capacitive load increases accordingly.

In the present embodiment, as illustrated in FIG. 2, the transistors TP2, TN2 and TP12 are coupled to the external terminal 14. On the other hand, in the comparative example, the transistors TP101, TN101, and TP102 are coupled to the external terminal 14. As described above, the sizes of the transistors TP2, TN2, and TP12 are smaller than the sizes of the transistors TP101, TN101, and TP102. Therefore, the value of the capacitive load at the external terminal 14 in the present embodiment is smaller than that of the structure in the comparative example.

The capacitive load at the external terminal 14 influences a frequency of the signal transmitted via the external terminal 14. A smaller value of the capacitive load at the external terminal 14 allows for a signal having a higher frequency to be transmitted without causing deformation of its waveform. Accordingly, in the present embodiment, high frequency responsiveness may be obtained in the input/output circuit 13.

The first embodiment has the advantages described below.

(1-1) The input/output circuit 13 of the semiconductor device 10 includes the output circuit 31, the input circuit 32, and the node control circuit 33, which are coupled to the external terminal 14. The analog input signal AI1 supplied from the external device to the external terminal 14 is transmitted as the analog input signal AI2 to the internal circuit via the wiring PL1 coupled to the external terminal 14.

The output circuit 31 includes the drive control circuit 41. The drive control circuit 41 generates the control signal DU for the output driver circuit 42 and the control signal DL for the output driver circuit 43 based on the digital output signal DO1 and the output control signal OE. The output driver circuit 42 includes the transistors TP1 and TP2 coupled between the external terminal 14 and the wiring VDD. The output driver circuit 43 includes the transistors TN1 and TN2 coupled between the external terminal 14 and the wiring VSS.

The node control circuit 33 supplies the control signal CV1 having a voltage equal to the voltage at the external terminal 14 to the node N11 between the transistors TP1 and TP2. Further, the node control circuit 33 supplies the control signal CV2 having a voltage equal to the voltage at the external terminal 14 to the node N12 between the transistors TN1 and TN2. Therefore, the voltage between the source and drain terminals of each of the transistors TP2 and TN2 coupled to the external terminal 14 is kept at 0 (zero). Thus, a leak current does not flow through each of the transistors TP2 and TN2. This reduces an undesirable change in the analog input signal AI2 transmitted to the internal circuit via the wiring PL1 with respect to the analog input signal AI1 supplied to the external terminal 14.

(1-2) The input circuit 32 includes the buffer circuit 61, the pull-up circuit 62, and the pull-up control circuit 63. The pull-up circuit 62 includes the transistors TP11 and TP12 coupled between the external terminal 14 and the wiring VDD. The pull-up control circuit 63 generates the control signal CR based on the pull resistance control signal RE. The pull-up circuit 62 is activated by the L level control signal CR and pulls up the voltage of the external terminal 14 to the power supply VDD.

The node control circuit 33 supplies the control signal CV3 having a voltage equal to the voltage at the external terminal 14 to the node N21 between the transistors TP11 and TP12. Therefore, the voltage between the source and drain terminals of the transistor TP12 coupled to the external terminal 14 is kept at 0 (zero). Thus, a leak current does not flow through the transistor TP12. This reduces an undesirable change in the analog input signal AI2 transmitted to the internal circuit via the wiring PL1 with respect to the analog input signal AI1 supplied to the external terminal 14.

(1-3) The node control circuit 33 includes the buffer circuit 81 that generates the control signal CV0 having a voltage equal to the voltage of the external terminal 14. Further, the node control circuit 33 includes the switch circuit 83 that generates the control signals CV1 to CV3 equal to the control signal CV0. The switch circuit 83 includes the analog switches 101 to 103 that control supply of the control signals CV1 to CV3 to three nodes to be controlled, namely, the nodes N11, N12, and N21. The analog switches 101 and 102 are activated and deactivated by the control signal CT for controlling the output driver circuits 42 and 43 of the output circuit 31. The analog switch 103 is activated and deactivated by the control signal CR for controlling the pull-up circuit 62 of the input circuit 32. The node control circuit 33, therefore, controls the supply of and the stop of the supply of the control signals CV1 to CV3 to the nodes N11, N12, and N21, respectively, in accordance with the operations of the output circuit 31 and the input circuit 32.

(1-4) The buffer control circuit 82 of the node control circuit 33 generates the buffer control signal BE based on the control signal CT of the output circuit 31 and the control signal CR of the input circuit 32. The buffer circuit 81 operates or stops based on the buffer control signal BE. Since the buffer circuit 81 stops according to the operations of the output circuit 31 and the input circuit 32, power consumption may be reduced.

(1-5) The buffer circuit 81 of the node control circuit 33 generates the control signal CV0 having a voltage equal to the voltage at the external terminal 14. The control signals CV1 to CV3 equal to this control signal CV0 are supplied to the nodes N11, N12, and N21, respectively. A fluctuation in the process for manufacturing the semiconductor device 10, a fluctuation in the operation temperature (chip temperature), and a fluctuation in the power supply voltage occasionally cause a potential difference between the control signal CV0 generated by the buffer circuit 81 and the voltage at the external terminal 14. However, such a potential difference is very small and does not influence (does not increase) a leak current in the transistors TP2, TN2, and TP12 coupled to the nodes N11, N12, and N21, respectively. Therefore, the node control circuit 33 may suppress an undesirable change in a waveform of the analog input signal AI2 without being influenced by the fluctuation in the manufacturing process and the like.

Second Embodiment

Figure 7:
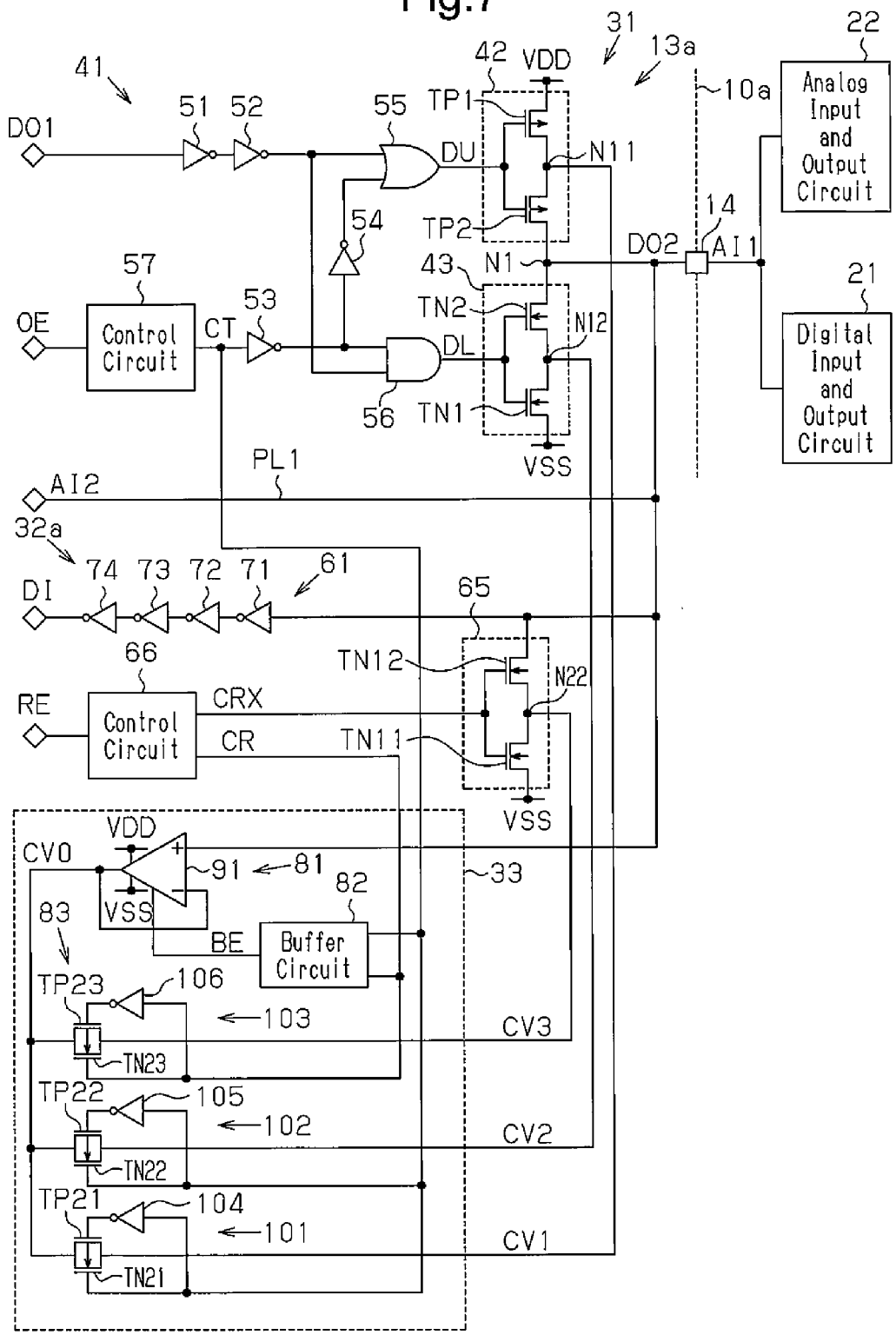
FIG. 7 is a circuit diagram of an input and output circuit according to a second embodiment.

As illustrated in FIG. 7, an input/output circuit 13a of a semiconductor device 10a includes the output circuit 31, an input circuit 32a, and the node control circuit 33.

The input circuit 32a includes the buffer circuit 61, a pull-down circuit 65, and a pull-down control circuit (in FIG. 7, described as a "control circuit") 66. The pull resistance control signal RE is supplied to the pull-down control circuit 66. The pull-down control circuit 66 includes, for example, a buffer circuit and a level conversion circuit.

The pull-down control circuit 66 generates the control signal CR based on the pull resistance control signal RE. For example, the pull-down control circuit 66 generates the control signal CR having a level logically equal to a level of the pull resistance control signal RE, and a control signal CRX complementary to the control signal CR. For example, the pull-down control circuit 66 includes an inverter circuit that logically inverts the control signal CR to generate the control signal CRX. The control signal CR is supplied to the node control circuit 33, and the control signal CRX is supplied to the pull-down circuit 65.

The pull-down circuit 65 includes transistors TN11 and TN12. The transistors TN11 and TN12 are N-channel MOS transistors. A source terminal of the transistor TN11 is coupled to a wiring VSS. A drain terminal of the transistor TN11 is coupled to a source terminal of the transistor TN12. A drain terminal of the transistor TN12 is coupled to an external terminal 14. That is, the transistors TN11 and TN12 are cascade-coupled between the external terminal 14 and the wiring VSS.

The control signal CRX is supplied to gate terminals of the transistors TN11 and TN12. The transistors TN11 and TN12 are activated and deactivated by the control signal CRX. For example, the transistors TN11 and TN12 are activated by the H level control signal CRX, and are deactivated by the L level control signal CRX. The activated transistors TN11 and TN12 pull down the external terminal 14 to the low potential voltage VSS based on the respective on-resistance.

The operation of the input/output circuit 13a will now be described below.

Figures 8, 9:
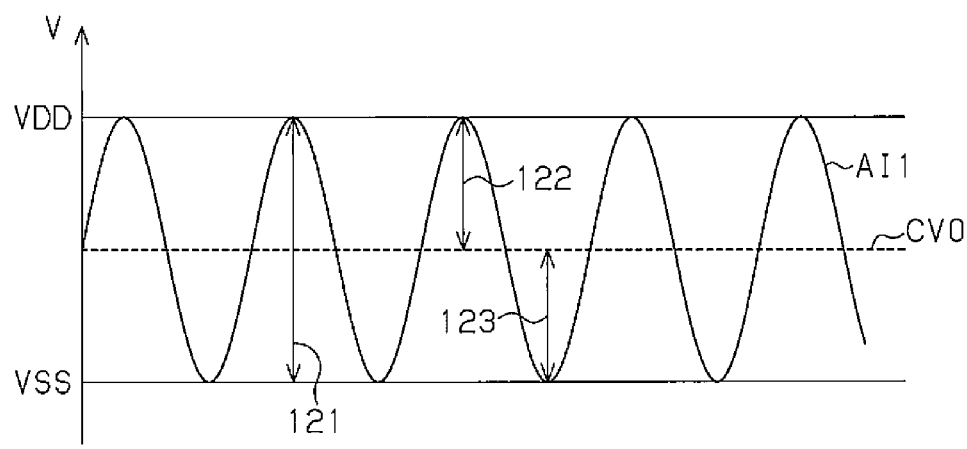
FIG. 8 is an operation explanatory diagram of the input and output circuit of FIG. 7.
FIG. 9 is an operation explanatory diagram of another buffer circuit.

FIG. 8 illustrates a logic level of each of control signals DU, DL, CT, CR, and CRX according to an operation state of the input/output circuit 13a, and an operation state of the buffer circuit 81 of the node control circuit 33.

In the input/output circuit 13a, the buffer circuit 81 of the node control circuit 33 generates the control signal CV0 having a voltage equal to a voltage at the external terminal 14. The control signal CV1 equal to the control signal CV0 is supplied to the node N11 between the transistors TP1 and TP2 of the output driver circuit 42. Therefore, a potential difference between the source and drain terminals of the transistor TP2 is 0 (zero). Thus, there is no leak current through the transistor TP2.

Similarly, the control signal CV2 equal to the control signal CV0 is supplied to the node N12 between the transistors TN1 and TN2 of the output driver circuit 43. Therefore, a potential difference between the source and drain terminals of the transistor TN2 is 0 (zero). Thus, there is no leak current through the transistor TN2.

Further, the control signal CV3 equal to the control signal CV0 is supplied to a node N22 between the transistors TN11 and TN12 of the pull-down circuit 65. Therefore, a potential difference between the source and drain terminals of the transistor TN12 is 0 (zero). Thus, there is no leak current through the transistor TN12.

The second embodiment has advantages similar to those in the first embodiment.

The first and second embodiments may be modified as follows.

In the first embodiment, as illustrated in parentheses in FIG. 3, the buffer control circuit 82 may stop the buffer circuit 81 during the period of the operation state "Output/Pull-Resistance Off." Similarly, in the second embodiment, as illustrated in parentheses in FIG. 8, the buffer control circuit 82 may stop the buffer circuit 81 during the period of the operation state "Output/Pull-Resistance Off."

In each of the first and second embodiments, the buffer circuit 81 generates the control signal CV0 having a level equal to a level of the analog input signal AI1 supplied to the external terminal 14. In the operational amplifier 91 of the buffer circuit 81, a tracking characteristic of the output signal with respect to a change in the input signal changes in accordance with the magnitude of an operation current supplied to a power supply terminal. The operational amplifier 91 that is operated by a minimum operation current (limited operation current) outputs the control signal CV0 that is substantially stable at a potential defined by its internal circuit.

For example, as indicated by a broken line in FIG. 9, the operational amplifier 91 outputs the control signal CV0 at a fixed level. In this case, the control signals CV1 to CV3 equal to the control signal CV0 are supplied to the node N11, N12, and N21 (in the second embodiment, the nodes N11, N12, and N22), respectively.

In the comparative example illustrated in FIG. 5, a maximum value of the voltage between the source and drain terminals of each of the transistors TP101, TN101, and TP102 is a difference voltage between the high potential voltage VDD and the low potential voltage VSS as indicated by an arrow 121 in FIG. 9.

In contrast, in the first embodiment illustrated in FIG. 2, a maximum value of the voltage between the source and drain terminals of each of the transistors TP2, TN2, and TP12 coupled to the external terminal 14 is a difference voltage between the analog input signal AI1 and the control signal CV0 (CV1 to CV3), that is, a voltage indicated by an arrow 122 or 123 in FIG. 9. The same applies to the second embodiment illustrated in FIG. 7.

In this manner, the voltage between the source and drain terminals of each of the transistors TP2, TN2, and TP12 (or the transistors TP2, TN2, and TN12) is smaller than that in the comparative example. Therefore, a leak current is reduced. Further, since the operational amplifier 91 is operated by a minimum operation current, current consumption of the operational amplifier 91 during the period of controlling the voltages at the nodes N11, N12, and N21 (or the nodes N11, N12, and N22) is reduced as compared to that in each of the above embodiments.

In the first embodiment, the input/output circuit 13 may include the pull-down circuit 65 illustrated in FIG. 7. Similarly, in the second embodiment, the input/output circuit 13a may include the pull-up circuit 62 illustrated in FIG. 2.

In each of the first and second embodiments, the control signals CT and CR supplied to the buffer control circuit 82 may be generated by, for example, a control circuit (e.g., a CPU) arranged in the internal circuit 12 illustrated in FIG. 1.

In each of the first and second embodiments, the buffer control circuit 82 may be omitted. In this case, the buffer circuit 81 may be controlled by, for example, a control circuit (e.g., a CPU) arranged in the internal circuit 12 illustrated in FIG. 1.

In each of the first and second embodiments, the buffer control circuit 82 may be omitted, and the buffer circuit 81 may be continuously operated. In this case, in order to suppress an increase in the power consumption, it is preferable that the operational amplifier 91 of the buffer circuit 81 be operated by a minimum operation current.

Third Embodiment

Figure 10:
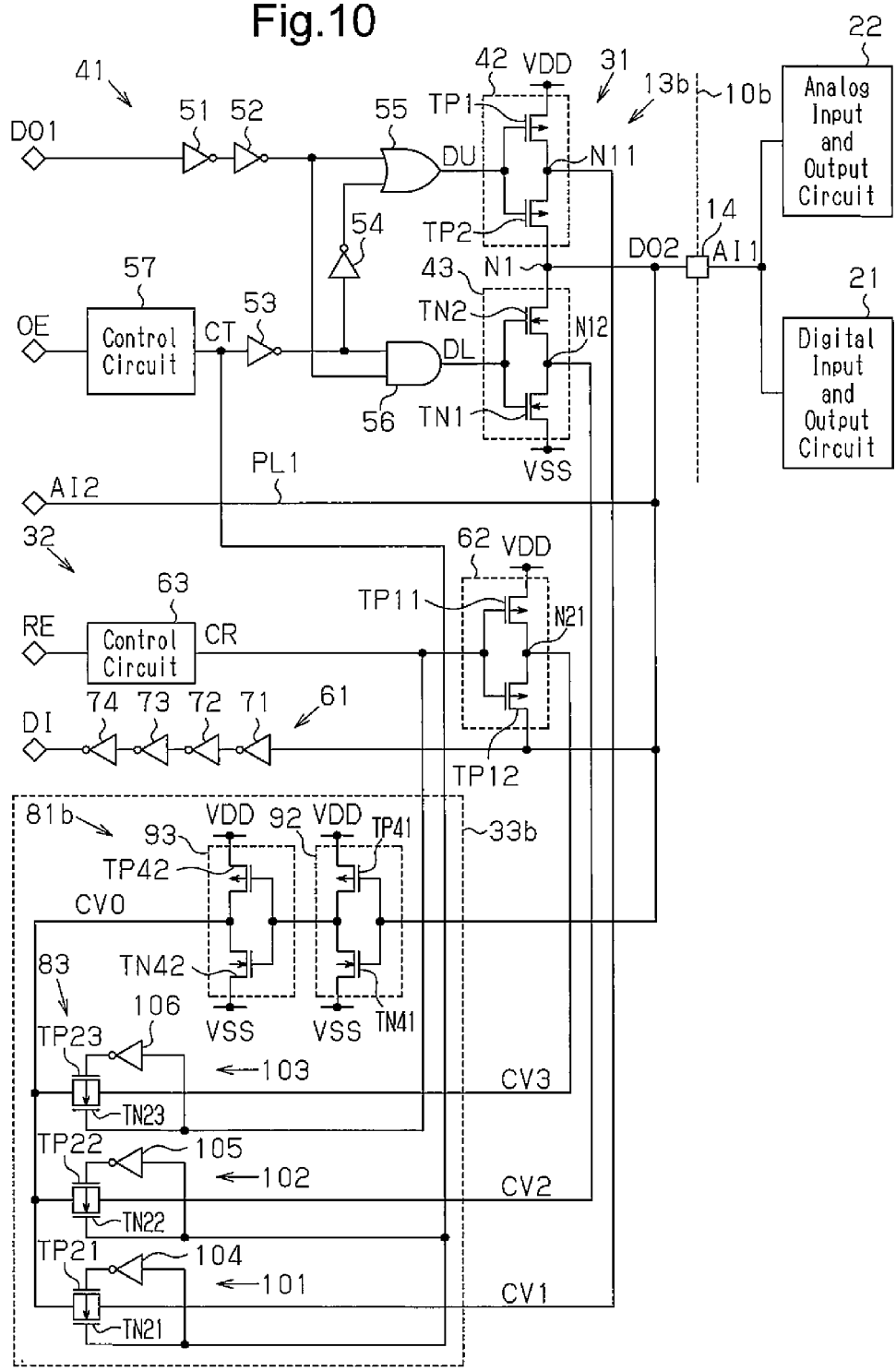
FIG. 10 is a circuit diagram of an input and output circuit according to a third embodiment.

As illustrated in FIG. 10, an input/output circuit 13b of a semiconductor device 10b includes the output circuit 31, the input circuit 32, and a node control circuit 33b.

The node control circuit 33b includes a buffer circuit 81b and the switch circuit 83. The buffer circuit 81b includes an even number of (two in FIG. 10) of inverter circuits 92 and 93 that are coupled in series.

The inverter circuit 92 includes a P-channel MOS transistor TP41 and an N-channel MOS transistor TN41. A source terminal of the transistor TP41 is coupled to the wiring VDD. A drain terminal of the transistor TP41 is coupled to a drain terminal of the transistor TN41. A source terminal of the transistor TN41 is coupled to the wiring VSS. Gate terminals of the transistors TP41 and TN41 are coupled to the external terminal 14.

The inverter circuit 93 includes a P-channel MOS transistor TP42 and an N-channel MOS transistor TN42. A source terminal of the transistor TP42 is coupled to the wiring VDD. A drain terminal of the transistor TP42 is coupled to a drain terminal of the transistor TN42. A source terminal of the transistor TN42 is coupled to the wiring VSS. Gate terminals of the transistors TP42 and TN42 are coupled to a node between the transistors TP41 and TN41 of the inverter circuit 92. The node between the transistors TP42 and TN42 is coupled to analog switches 101 to 103 of the switch circuit 83.

The buffer circuit 81b outputs the control signal CV0 having an H level (a level of the high potential voltage VDD) or L level (a level of the low potential voltage VSS) based on the voltage of the external terminal 14. That is, the buffer circuit 81b is a CMOS buffer circuit that generates the control signal CV0 that is in full swing in a voltage range from the high potential voltage VDD to the low potential voltage VSS.

The operation of the input/output circuit 13b in the third embodiment will now be described below.

FIG. 11 illustrates a logic level of each of the control signals DU, DL, CT, and CR according to an operation state of the input/output circuit 13b.

In the buffer circuit 81b, the voltage at the external terminal 14 is greater than or equal to a threshold voltage Vth of the inverter circuit 92, the inverter circuit 92 outputs an L level signal. The threshold voltage Vth is set based on characteristics of the transistors TP41 and TN41 of the inverter circuit 92. For example, the threshold voltage Vth is a middle voltage ((VDD+VSS)/2) between the high potential voltage VDD and the low potential voltage VSS. The inverter circuit 93 outputs the H level control signal CV0 in response to the L level signal output from the inverter circuit 92. When the voltage at the external terminal 14 is lower than the threshold voltage Vth, the inverter circuit 92 outputs an H level signal. Therefore, the inverter circuit 93 outputs the L level control signal CV0.

In the input/output circuit 201 of the comparative example illustrated in FIG. 5, when the analog input signal AI1 has the level of the high potential voltage VDD, the voltage between the source and drain terminals of the transistor TN101 is a difference voltage between the high potential voltage VDD and the low potential voltage VSS. Therefore, a leak current according to the difference voltage flows through the transistor TN101.

Similarly, when the analog input signal AI1 has the level of the low potential voltage VSS, the voltage between the source and drain terminals of the transistor TP101 is a difference voltage between the high potential voltage VDD and the low potential voltage VSS. Therefore, a leak current according to the difference voltage flows through the transistor TP101.

In contrast, in the third embodiment, when the analog input signal AI1 has the level of the high potential voltage VDD, the control signal CV2 (CV0) having the level of the high potential voltage VDD is supplied to the node N12 (i.e., the source terminal of the transistor TN2). Therefore, the voltage between the source and drain terminals of the transistor TN2 is kept at 0 (zero). Thus, there is no leak current through the transistor TN2.

Similarly, when the voltage of the analog input signal AI1 is greater than or equal to the threshold voltage Vth of the inverter circuit 92, the control signal CV2 (CV0) having the level of the high potential voltage VDD is supplied to the node N12 (i.e., the source terminal of the transistor TN2). In this case, a potential difference between the source and drain terminals of the transistor TN2 is smaller than the potential difference between the source and drain terminals of the transistor TN101 in the comparative example illustrated in FIG. 5. Therefore, a leak current flowing through the transistor TN2 is reduced as compared to the leak current flowing through the transistor TN101 in the comparative example.

When the analog input signal AI1 has the level of the low potential voltage VSS, the control signal CV1 (CV0) having the level of the low potential voltage VSS is supplied to the node N11 (i.e., the source terminal of the transistor TP2). Therefore, the voltage between the source and drain terminals of the transistor TP2 is kept at 0 (zero). Thus, there is no leak current through the transistor TP2.

Similarly, when the voltage of the analog input signal AI1 is lower than the threshold voltage Vth of the inverter circuit 92, the control signal CV1 (CV0) having the level of the low potential voltage VSS is supplied to the node N11 (i.e., the source terminal of the transistor TP2). In this case, a potential difference between the source and drain terminals of the transistor TP2 is smaller than the potential difference between the source and drain terminals of the transistor TP101 in the comparative example illustrated in FIG. 5. Therefore, a leak current flowing through the transistor TP2 is reduced as compared to the leak current flowing through the transistor TP101 in the comparative example.

The pull-up circuit 62 includes the transistors TP11 and TP12 that are cascade-coupled. Therefore, in the same manner as the output driver circuit 42, in the pull-up circuit 62, a leak current flowing through the transistor TP12 is reduced as compared to the leak current flowing through the transistor TP102 in the comparative example.

The third embodiment further has the advantages described below.

(3-1) The node control circuit 33b includes the buffer circuit 81b and the switch circuit 83. The buffer circuit 81b includes the two inverter circuits 92 and 93. The inverter circuit 92 is a CMOS inverter circuit including the P-channel MOS transistor TP41 and the N-channel MOS transistor TN41. Similarly, the inverter circuit 93 is a CMOS inverter circuit including the P-channel MOS transistor TP42 and the N-channel MOS transistor TN42. The buffer circuit 81b is a CMOS buffer circuit that generates the control signal CV0 that is in full swing in the voltage range from the high potential voltage VDD to the low potential voltage VSS. The control signals CV1 to CV3 each having a voltage equal to the control signal CV0 are supplied to the nodes N11, N12, and N21, respectively. A voltage difference between the node N11 and the external terminal 14, that is, the voltage between the source and drain terminals of the transistor TP2 is smaller than that of the transistor TP101 in the comparative example. Further, a voltage difference between the node N12 and the external terminal 14, that is, the voltage between the source and drain terminals of the transistor TN2 is smaller than that of the transistor TN101 in the comparative example. Further, a voltage difference between the node N21 and the external terminal 14, that is, the voltage between source and drain terminals of the transistor TP12 is smaller than that of the transistor TP102 in the comparative example. Therefore, the leak current flowing through each of the transistors TP2, TN2, and TP12 is reduced as compared to that in the comparative example. As a result, an undesirable change in a waveform of the analog input signal AI2 is suppressed.

(3-2) The buffer circuit 81b includes the CMOS inverter circuits 92 and 93. The inverter circuits 92 and 93 do not consume current in a static state where the voltages at the gate terminals do not change. Therefore, the use of the node control circuit 33b may suppress an increase in the power consumption.

Fourth Embodiment

Figure 12:
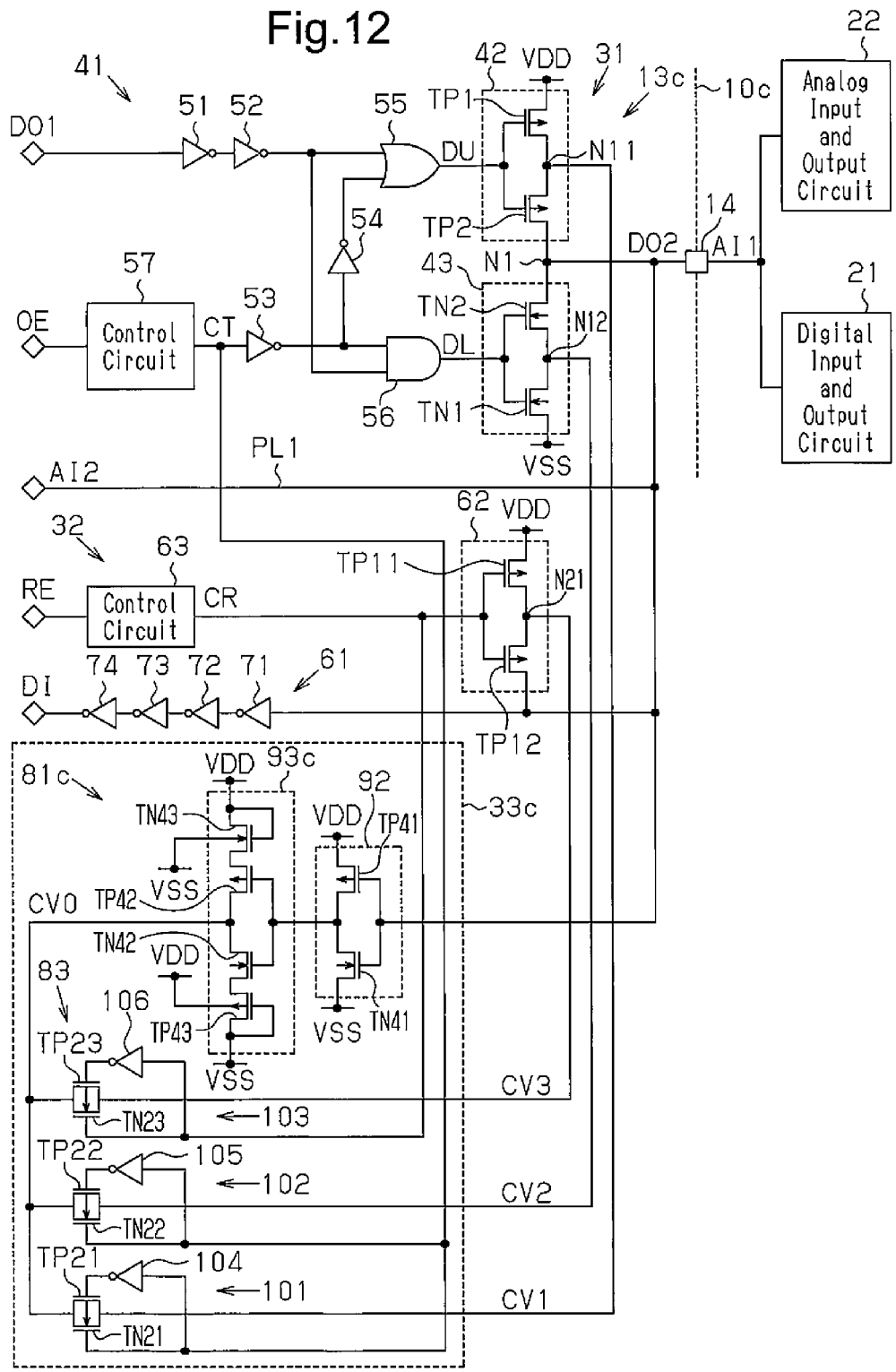
FIG. 12 is a circuit diagram of an input and output circuit according to a fourth embodiment.

As illustrated in FIG. 12, an input/output circuit 13c of a semiconductor device 10c includes the output circuit 31, the input circuit 32, and a node control circuit 33c.

The node control circuit 33c includes a buffer circuit 81c and the switch circuit 83. The buffer circuit 81c includes an even number of (two in FIG. 12) of inverter circuits 92 and 93c that are coupled in series.

The inverter circuit 93c includes P-channel MOS transistors TP42 and TP43 and N-channel MOS transistors TN42 and TN43. An output signal from the inverter circuit 92 is supplied to gate terminals of the transistors TP42 and TN42. A source terminal of the transistor TP42 is coupled to a source terminal of the transistor TN43. A drain terminal of the transistor TN43 is coupled to the wiring VDD. A gate terminal of the transistor TN43 is coupled to the wiring VDD. A back gate terminal of the transistor TN43 is coupled to the wiring VSS.

A source terminal of the transistor TN42 is coupled to a source terminal of the transistor TP43. A drain terminal of the transistor TP43 is coupled to the wiring VSS. A gate terminal of the transistor TP43 is coupled to the wiring VSS. A back gate terminal of the transistor TP43 is coupled to the wiring VDD. Although not illustrated nor explained in each of the above embodiments, a back gate terminal of the P-channel MOS transistor is coupled to, for example, the wiring VDD, and a back gate terminal of the N-channel MOS transistor is coupled to, for example, the wiring VSS.

In the inverter circuit 93c, the source terminal of the transistor TP42 is set to a voltage VD1 that is lower than the high potential voltage VDD by a threshold voltage of the transistor TN43. On the other hand, the source terminal of the transistor TN42 is set to a voltage VS1 that is higher than the low potential voltage VSS by a threshold voltage of the transistor TP43.

Therefore, the buffer circuit 81c outputs the control signal CV0 that has a level of the high potential voltage VD1 or a level of the low potential voltage VS1 based on the voltage of the external terminal 14. That is, in the buffer circuit 81c, the control signal CV0 is in full swing in a voltage range from the voltage VD1, which is lower than the high potential voltage VDD, to the voltage VS1, which is higher than the low potential voltage VSS.

The operation of the input/output circuit 13c in the fourth embodiment will now be described below.

A logic level of each of the control signals DU, DL, CT, and CR in the fourth embodiment is the same as the logic level in the third embodiment illustrated in FIG. 11.

In the fourth embodiment, when the analog input signal AI1 has the level of the high potential voltage VDD, the control signal CV2 (CV0) having the level of the voltage VD1 is supplied to the node N12 (i.e., the source terminal of the transistor TN2). Similarly, when the voltage of the analog input signal AI1 is greater than or equal to a threshold voltage Vth of the inverter circuit 92, the control signal CV2 having the level of the voltage VD1 is supplied to the node N12 (i.e., the source terminal of the transistor TN2). The voltage VD1 is lower than the high potential voltage VDD, and is higher than the middle voltage Vc ((VDD+VSS)/2). Therefore, a maximum value of a potential difference between the source and drain terminals of the transistor TN2 is smaller than that in the third embodiment. Thus, a leak current flowing through the transistor TN2 is reduced as compared to that in the third embodiment.

When the analog input signal AI1 has the level of the low potential voltage VSS, the control signal CV1 (CV0) having the level of the voltage VS1 is supplied to the node N11 (i.e., the source terminal of the transistor TP2). Similarly, when the voltage of the analog input signal AI1 is lower than the threshold voltage Vth of the inverter circuit 92, the control signal CV1 having the level of the voltage VS1 is supplied to the node N11 (i.e., the source terminal of the transistor TP2). The voltage VS1 is higher than the low potential voltage VSS and lower than the middle voltage Vc. Therefore, a maximum value of a potential difference between the source and drain terminals of the transistor TP2 is smaller than that in the third embodiment. Thus, a leak current flowing through the transistor TP2 is reduced as compared to that in the third embodiment.

The pull-up circuit 62 includes the transistors TP11 and TP12 that are cascade-coupled. Therefore, in the same manner as the output driver circuit 42, in the pull-up circuit 62, a leak current flowing through the transistor TP12 is reduced as compared to that in the third embodiment.

The fourth embodiment further has the advantages described below.

(4-1) The node control circuit 33c includes the buffer circuit 81c and the switch circuit 83. The buffer circuit 81c includes the two inverter circuits 92 and 93c. The inverter circuit 92 is a CMOS inverter circuit including the P-channel MOS transistor TP41 and the N-channel MOS transistor TN41. The inverter circuit 93c includes the P-channel MOS transistors TP42 and TP43, and the N-channel MOS transistors TN42 and TN43. The output signal from the inverter circuit 92 is supplied to the gate terminals of the transistors TP42 and TN42. The transistor TP42 is coupled to the wiring VDD via the diode-coupled transistor TN43. The transistor TN42 is coupled to the wiring VSS via the diode-coupled transistor TP43.

Therefore, the buffer circuit 81c generates the control signal CV0 that is in full swing in a voltage range narrower than the voltage range from the high potential voltage VDD to the low potential voltage VSS. The control signals CV1 to CV3 each having a voltage equal to this control signal CV0 are supplied to the nodes N11, N12, and N21, respectively. In the same manner as the third embodiment, the voltage between the source and drain terminals of each of transistors TP2, TN2, and TP12 is smaller than that of each of the transistors TP101, TN101, and TP102 in the comparative example. Therefore, the leak current flowing through each of the transistors TP2, TN2, and TP12 is reduced as compared to that in the comparative example. As a result, an undesirable change in a waveform of the analog input signal AI2 is suppressed.

(4-2) The buffer circuit 81c includes the CMOS inverter circuits 92 and 93c. The inverter circuits 92 and 93c do not consume current in a static state where the voltages at the gate terminals do not change. Therefore, the use of the node control circuit 33c may suppress an increase in power consumption.

It should be apparent to those skilled in the art that the above embodiment may be embodied in many other specific forms without departing from the scope of the invention. Particularly, it should be understood that the above embodiment may be embodied in the following forms.

In the third embodiment, the input/output circuit 13b may include the pull-down circuit 65 illustrated in FIG. 7. Similarly, in the fourth embodiment, the input/output circuit 13c may include the pull-down circuit 65 illustrated in FIG. 2. Further, the input/output circuits 13b and 13c each may include the pull-up circuit 62 and the pull-down circuit 65.

In each of the first to fourth embodiments, the input/output circuit (13, 13a, 13b, or 13c) is coupled to the external terminal 14. Instead, a circuit that includes the input circuit 32 and the node control circuit 33 corresponding to the input circuit 32 may be coupled to the external terminal 14. Alternatively, a circuit that includes the output circuit 31 and the node control circuit 33 corresponding to the output circuit 31 may be coupled to the external terminal 14.

In each of the first to fourth embodiments, the structure of the node control circuit (33, 33b, or 33c) may be suitably modified. For example, the node control circuit may include three buffer circuits corresponding to the nodes N11, N12, and N21 (or the nodes N11, N12, and N22 in FIG. 7), respectively. Further, the node control circuit may include a first buffer circuit corresponding to the output circuit 31 (that is, the nodes N11 and N12), and a second buffer circuit corresponding to the input circuit 32 or 32a (that is, the node N21 or N22). In this case, the buffer circuits 81, 81b, and 81c may be combined.

Further, a buffer circuit may be arranged for each of the nodes N11, N12, and N21 (N22). Further, a switch circuit may be arranged between an input terminal of each buffer circuit and the external terminal 14. In this case, the structure of each buffer circuit is suitably modified so that input/output of a digital signal in the output circuit 31 and the input circuits 32 and 32a is not influenced (for example, the output terminal is set into a high-impedance state).

The buffer circuit 61 of each of the input circuits 32 and 32a is coupled to the external terminal 14. Thus, the voltage at the external terminal 14 is supplied to the buffer circuit 61. Therefore, in the third embodiment, the inverter circuit may be shared between the node control circuit 33b and the input circuit 32.

For example, in the third embodiment, the output signal from the inverter circuit 72 or 74 of the buffer circuit 61 may be supplied as the control signal CV0 to each of the nodes N11, N12, and N21 (N22). In this case, the buffer circuit 81c of the node control circuit 33b may be omitted.

Similarly, in the fourth embodiment, the output signal from the inverter circuit 71 or 73 of the buffer circuit 61 may be supplied to the inverter circuit 93c of the node control circuit 33c. In this case, the inverter circuit 92 may be omitted.

In each of the first to fourth embodiments, the output circuit (or input/output circuit) may include any one of the output driver circuit 42 on the high-potential side and the output driver circuit 43 on the low-potential side.

In the third embodiment, at the time of inputting/outputting the digital signal, the input terminal of the buffer circuit 81b may be separated from the external terminal 14 and may be pulled up to the voltage VDD (or pulled down to the voltage VSS). For example, such a control circuit includes the buffer control circuit 82 of the node control circuit 33 in the first embodiment and a switch circuit that selectively couples the input terminal of the buffer circuit 81b to the external terminal 14 or the wiring VDD (or VSS) based on the output signal from the buffer control circuit 82. In this structure, the buffer circuit 81b does not operate at the time of inputting/outputting the digital signal. Therefore, switching noises or the like may be suppressed. This modification may be also applied to the fourth embodiment in the same manner.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments of the present invention have been described in detail, it should be understood that various changes, substitutions, and alterations could be made hereto without departing from the spirit and scope of the invention.

The invention claimed is:

1. An output circuit comprising:
   a driver circuit including
      a first transistor including one end coupled to an external terminal and the other end coupled to a first node, and
      a second transistor including one end coupled to the first node and the other end coupled to a wiring that is supplied with a power supply voltage; and
   a node control circuit that, when the first transistor and the second transistor are deactivated, supplies a node control signal based on a voltage of the external terminal to the first node.

2. An output circuit comprising:
   an output unit including a first driver circuit, a second driver circuit, and a drive control circuit, wherein
      the first driver circuit includes
         a first transistor including one end coupled to an external terminal and the other end coupled to a first node, and
         a second transistor including one end coupled to the first node and the other end coupled to a first wiring that is supplied with a first voltage,
      the second driver circuit includes
         a third transistor including one end coupled to the external terminal and the other end coupled to a second node, and
         a fourth transistor including one end coupled to the second node and the other end coupled to a second wiring that is supplied with a second voltage, and
      the drive control circuit is configured to receive an output control signal and an output signal, complementarily activate and deactivate the first and second driver circuits based on the output signal when the output control signal is at a first level, and deactivate the first and second driver circuits when the output control signal is at a second level; and a node control circuit that, when the first and second driver circuits are deactivated based on the output control signal, supplies a node control signal based on a voltage of the external terminal to each of the first node and the second node.

3. The output circuit according to claim 2, wherein the node control circuit includes a buffer circuit that outputs the node control signal according to the voltage of the external terminal, and a switch circuit that supplies the node control signal to each of the first node and the second node or stops the supply of the node control signal.

4. The output circuit according to claim 3, wherein the switch circuit includes a first switch circuit coupled between the buffer circuit and the first node, and a second switch circuit coupled between the buffer circuit and the second node.

5. The output circuit according to claim 3, wherein the buffer circuit is a non-inverting amplifying circuit.

6. The output circuit according to claim 5, wherein the node control circuit includes a buffer control circuit that controls operation and stop of the buffer circuit.

7. The output circuit according to claim 3, wherein the buffer circuit is configured to generate the node control signal having a voltage equal to the voltage of the external terminal.

8. The output circuit according to claim 3, wherein the buffer circuit is configured to be operated by a limited operation current.

9. The output circuit according to claim 3, wherein the buffer circuit includes an even number of inverter circuits coupled in series.

10. The output circuit according to claim 9, wherein the even number of inverter circuits include an output inverter circuit that outputs the node control signal, and the output inverter circuit is configured to output the node control signal having an amplitude that changes in a voltage range narrower than a voltage range from the first voltage to the second voltage.

11. The output circuit according to claim 2, further comprising:

an input unit that is coupled to the external terminal and configured to generate a digital input signal according to the voltage of the external terminal, wherein the input unit includes a pull-up circuit including fifth and sixth transistors cascade-coupled between the external terminal and the first wiring, and a pull-up control circuit that controls to activate and deactivate the fifth and sixth transistors, and the node control circuit is configured to supply the node control signal to a third node between the fifth and sixth transistors.

12. The output circuit according to claim 11, wherein the node control circuit includes a third switch circuit that is coupled between the third node and the external terminal and configured to control supply of the node control signal.

13. The output circuit according to claim 2, further comprising:

an input unit that is coupled to the external terminal and configured to generate a digital input signal according to the voltage of the external terminal, wherein the input unit includes a pull-down circuit including seventh and eighth transistors cascade-coupled between the external terminal and the second wiring, and a pull-down control circuit that controls to activate and deactivate the seventh and eighth transistors, and the node control circuit is configured to supply the node control signal to a fourth node between the seventh and eighth transistors.

14. The output circuit according to claim 13, wherein the node control circuit includes a fourth switch circuit that is coupled between the fourth node and the external terminal and configured to control supply of the node control signal.

* * * * *